(12) United States Patent
Do

(10) Patent No.: US 8,356,214 B2
(45) Date of Patent: Jan. 15, 2013

(54) INTERNAL SIGNAL MONITORING DEVICE IN SEMICONDUCTOR MEMORY DEVICE AND METHOD FOR MONITORING THE SAME

(75) Inventor: Chang-Ho Do, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 814 days.

(21) Appl. No.: 11/823,616

(22) Filed: Jun. 28, 2007

(65) Prior Publication Data

US 2008/0077830 A1 Mar. 27, 2008

(30) Foreign Application Priority Data

Sep. 21, 2006 (KR) .................. 10-2006-0091630

(51) Int. Cl.
*G11C 29/00* (2006.01)
*G01R 31/28* (2006.01)
(52) U.S. Cl. .................. 714/718; 714/724; 714/734
(58) Field of Classification Search .......... 714/718–724; 365/200, 201
See application file for complete search history.

(56) References Cited

U.S. PATENT DOCUMENTS

| | | | | |
|---|---|---|---|---|
| 5,821,794 A * | 10/1998 | Nazarian et al. | ............. | 327/298 |
| 6,138,255 A | 10/2000 | Noji | | |
| 6,252,820 B1 * | 6/2001 | Nakamura | ............. | 365/233.1 |
| 6,996,754 B1 | 2/2006 | Lee | | |
| 7,389,452 B2 * | 6/2008 | Agarwal | ............. | 714/724 |
| 7,554,857 B2 * | 6/2009 | Lee | ............. | 365/189.02 |
| 7,669,096 B2 * | 2/2010 | Agarwal | ............. | 714/724 |
| 2005/0209715 A1 * | 9/2005 | Moser et al. | ............. | 700/79 |
| 2005/0289418 A1 * | 12/2005 | Agarwal | ............. | 714/726 |
| 2009/0040059 A1 * | 2/2009 | Dauphinee et al. | ............. | 340/653 |
| 2009/0219053 A1 * | 9/2009 | Masleid | ............. | 326/113 |

FOREIGN PATENT DOCUMENTS

| | | |
|---|---|---|
| CN | 1659663 | 8/2005 |
| JP | 03-205696 | 9/1991 |
| JP | 10-222978 | 8/1998 |
| JP | 11-274906 | 10/1999 |
| JP | 2000-011698 | 1/2000 |
| JP | 2001-195897 | 7/2001 |
| JP | 2002-237200 | 8/2002 |
| KR | 10-0267764 B1 | 7/2000 |
| KR | 10-20010028862 A | 4/2001 |

* cited by examiner

*Primary Examiner* — John Trimmings
*Assistant Examiner* — Daniel McMahon
(74) *Attorney, Agent, or Firm* — Blakely, Sokoloff, Taylor & Zafman

(57) ABSTRACT

An internal signal monitoring device in a semiconductor memory device includes: an internal signal input unit to receive an internal signal to be monitored and having an output to provide a monitor source signal in response to a test mode signal; and an internal signal output unit having an input coupled to the output of the internal signal input unit, the internal signal output unit to transmit the monitor source signal to a predetermined pad of the semiconductor memory device in response to the test mode signal.

10 Claims, 9 Drawing Sheets

INTERNAL SIGNAL MONITORING DEVICE IN SEMICONDUCTOR MEMORY DEVICE AND METHOD FOR MONITORING THE SAME

CROSS-REFERENCE TO RELATED APPLICATIONS

The present invention claims priority of Korean patent application number 10-2006-91630, filed on Sep. 21, 2006, which is incorporated by reference in its entirety.

BACKGROUND OF THE INVENTION

The present invention relates to a semiconductor design technique, and more particularly, an internal signal monitoring device in a semiconductor memory device and a method for monitoring the same.

A semiconductor memory device transmits data read from a memory cell to an input/output pad (DQ pad) through various internal signals. At this time, there is the problem that the data is distortedly transmitted or is not transmitted due to diverse factors. One of the factors is a distortion of the internal signals, which is monitored by observing operational states of the internal signals based on whether the data as desired is or not actually output to the input/output pad. When the desired data is not output, different types of tests are performed to compare the desired data and an actual output data and to try to find a doubtful internal circuit. Further, an oscilloscope connected to a device such as a Pico-probe, or an expensive internal signal probing device is used to read out the internal signals, thereby detecting that something is wrong with the internal signals.

However, using the oscilloscope connected to the pico-probe or the internal signal probing device requires great skill compared to a simple task of determining a pass/fail of data output.

Moreover, signals actually used in the semiconductor memory device, which are output signals from a small driver stage constructed in a semiconductor chip, become distorted when an external device such as the Pico-probe is directly contacted to a node to be inspected for the purpose of monitoring such internal signals. Thus the internal signals and operational states thereof cannot be exactly monitored. In addition, since an interconnection in the semiconductor chip is typically enclosed with a protective coating, a prior process to remove the protective coating is required for monitoring the internal signals. For example, FIG. 1 shows a block diagram illustrating a conventional internal signal monitoring device in the semiconductor memory device.

Moreover, because a semiconductor chip is typically packaged and such a packaged semiconductor chip should be dismantled in order to monitor the internal signals through the Pico-probe or the internal signal probing device, it is difficult to monitor the internal signals in the packaged semiconductor chip.

SUMMARY OF THE INVENTION

An embodiment of the invention is directed to an internal signal monitoring device in a semiconductor memory device and a method for monitoring the same, capable of precisely monitoring an internal signal without distortion.

The invention may be capable of more easily and more rapidly monitoring an internal signal.

In accordance with an aspect of the present invention, there is provided an internal signal monitoring device in a semiconductor memory device, including: an internal signal input unit to receive an internal signal to be monitored and having an output to provide a monitor source signal in response to a test mode signal; and an internal signal output unit having an input coupled to the output of the internal signal input unit, the internal signal output unit to transmit the monitor source signal to a predetermined pad of the semiconductor memory device in response to the test mode signal.

Further, in accordance with another aspect of the present invention, there is provided a method for monitoring an internal signal of a semiconductor memory device, including: outputting a monitor source signal within the semiconductor memory device, by receiving the internal signal to be monitored and in response to a test mode signal; and transmitting the monitor source signal to a predetermined pad of the semiconductor memory device in response to the test mode signal.

DESCRIPTION OF SPECIFIC EMBODIMENTS

Hereinafter, an internal signal monitoring device in a semiconductor memory device in accordance with exemplary embodiments of the present invention will be described in detail with reference to the accompanying drawings.

Figure 1:
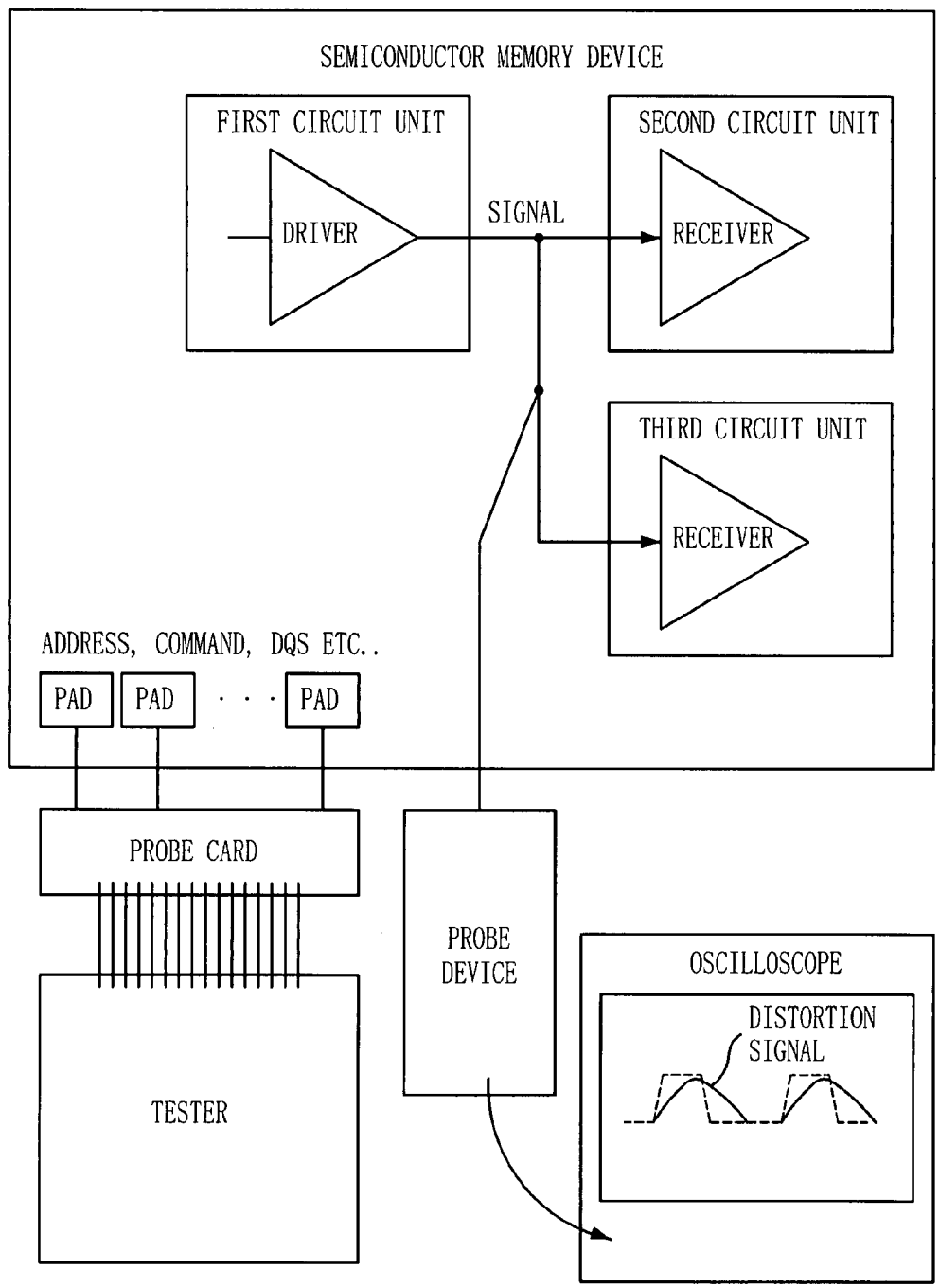
FIG. 1 shows a block diagram illustrating a conventional internal signal monitoring device in a semiconductor memory device.
Figure 2A:
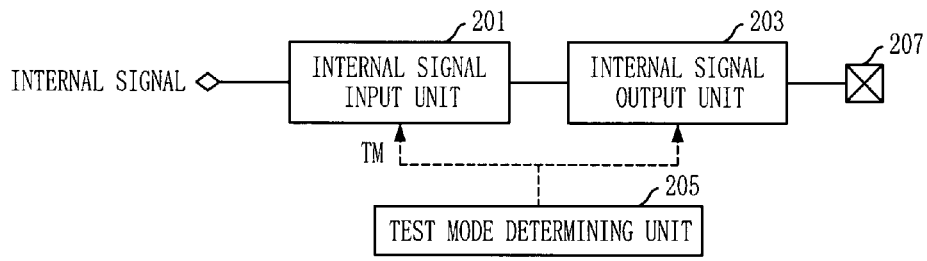
FIGS. 2A and 2B show block diagrams illustrating an internal signal monitoring device in a semiconductor memory device in accordance with a preferred embodiment of the present invention.
Figure 2B:
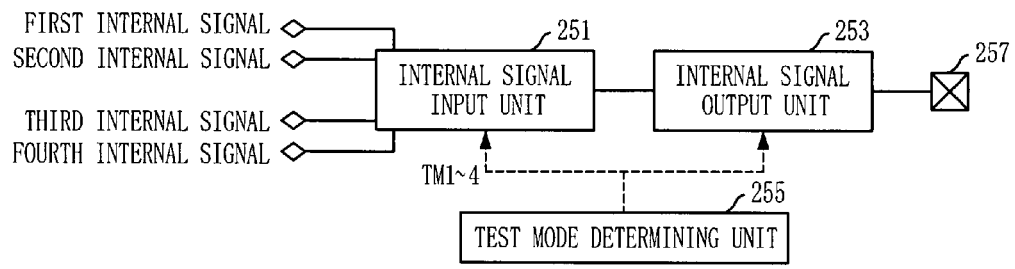

FIGS. 2A and 2B show block diagrams illustrating an internal signal monitoring device in a semiconductor memory device in accordance with a preferred embodiment of the present invention.

In FIG. 2A, the internal signal monitoring device in the semiconductor memory device includes an internal signal input unit 201, an internal signal output unit 203, a test mode determining unit 205 and a pad 207.

The internal signal input unit 201 receives an internal signal to be monitored in response to a test mode signal TM. The internal signal output unit 203 receives a monitor source signal SOURCESIG output from the internal signal input unit 201 and transmits a monitor signal OUTSIG to the pad 207 in response to the test mode signal TM. The test mode determining unit 205 outputs a test mode signal TM.

The pad 207 may be an address pad for receiving an address signal, a data pad for receiving/outputting data, a command pad for receiving a command signal, and a monitor dedicated pad, which may be a spare pad to be dedicated for monitoring the internal signal in the semiconductor memory device as likely used hereinafter.

Referring to FIG. 2B, an internal signal monitoring device in the semiconductor memory device includes an internal signal input unit 251, an internal signal output unit 253, a test mode determining unit 255 and a pad 257.

The internal signal input unit 251 receives first to fourth internal signals to be monitored in response to first to fourth test mode signals TM1 to TM4. The internal signal output unit 253 receiving a monitor source signal SOURCESIG output from the internal signal input unit 251 and transmits a monitor signal OUTSIG to the pad 257 in response to the first to fourth test mode signals TM1 to TM4. The test mode determining unit 255 outputs the first to fourth test mode signals TM1 to TM4.

The internal signal monitoring device shown in FIG. 2B is similar to that shown in FIG. 2A, but provided with the internal signal input unit 251 for receiving the first to fourth internal signals, differing from the internal signal input unit 201 for receiving one internal signal.

The internal signal input unit 251 is described in connection with FIG. 3.

Figure 3:
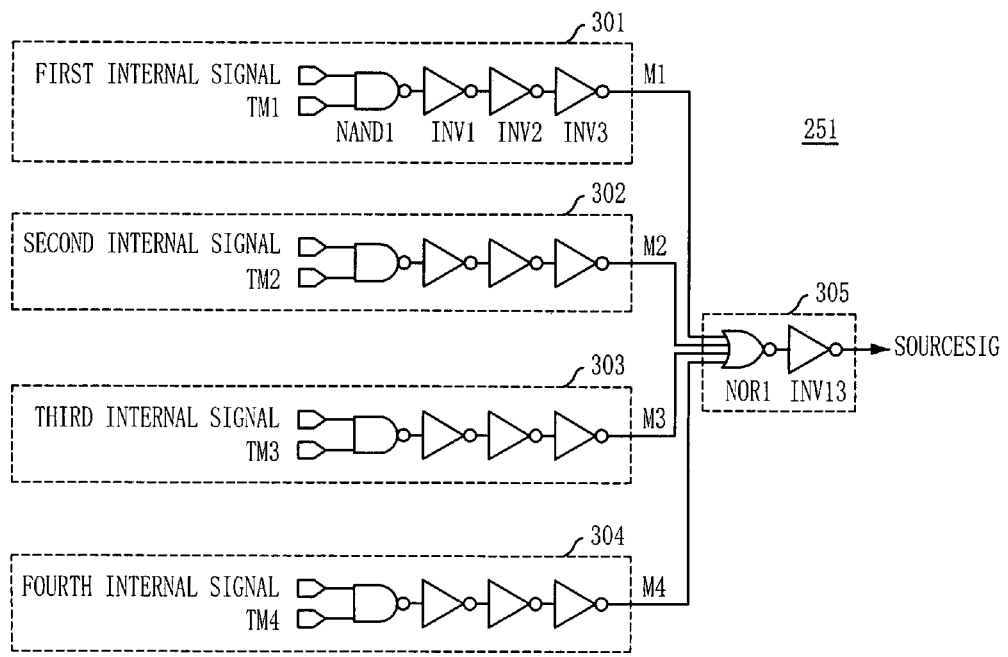
FIG. 3 is a circuit diagram illustrating an internal signal input unit shown in FIG. 2B.

In FIG. 3, the internal signal input unit 251 has a first input sector 301, a second input sector 302, a third input sector 303, a fourth input sector 304 and a combiner 305.

Meanwhile, the internal signal input unit 201 shown in FIG. 2A may consist of a single input sector, e.g., the first input sector 301 in the internal signal input unit 251 shown in FIG. 2B.

The first input sector 301 includes a first NAND gate NAND1 and first to third inverters INV1, INV2 and INV3. The first NAND gate NAND1 receives a first internal signal and a first separate test mode signal TM1, and the first to third inverters INV1 to INV3 buffers an output signal of the first NAND gate NAND1.

The second input sector 302, the third input sector 303 and the fourth input sector 304 also employ the same circuit as the first input sector 301, but receive a second, a third and a fourth internal signals and separate test mode signals TM2, TM3 and TM4.

The combiner 305 includes a first NOR gate NOR1 and a fourth inverter INV13. The first NOR gate NOR1 receives output signals of the first to fourth input sectors 301 to 304, i.e., first to fourth individual monitor source signals M1 to M4. The fourth inverter INV13 inverts an output signal of the first NOR gate NOR1 to output a monitor source signal SOURCESIG.

Alternatively, the combiner 305 may be implemented as a circuit shown in FIG. 4, as described hereinafter.

Figure 4:
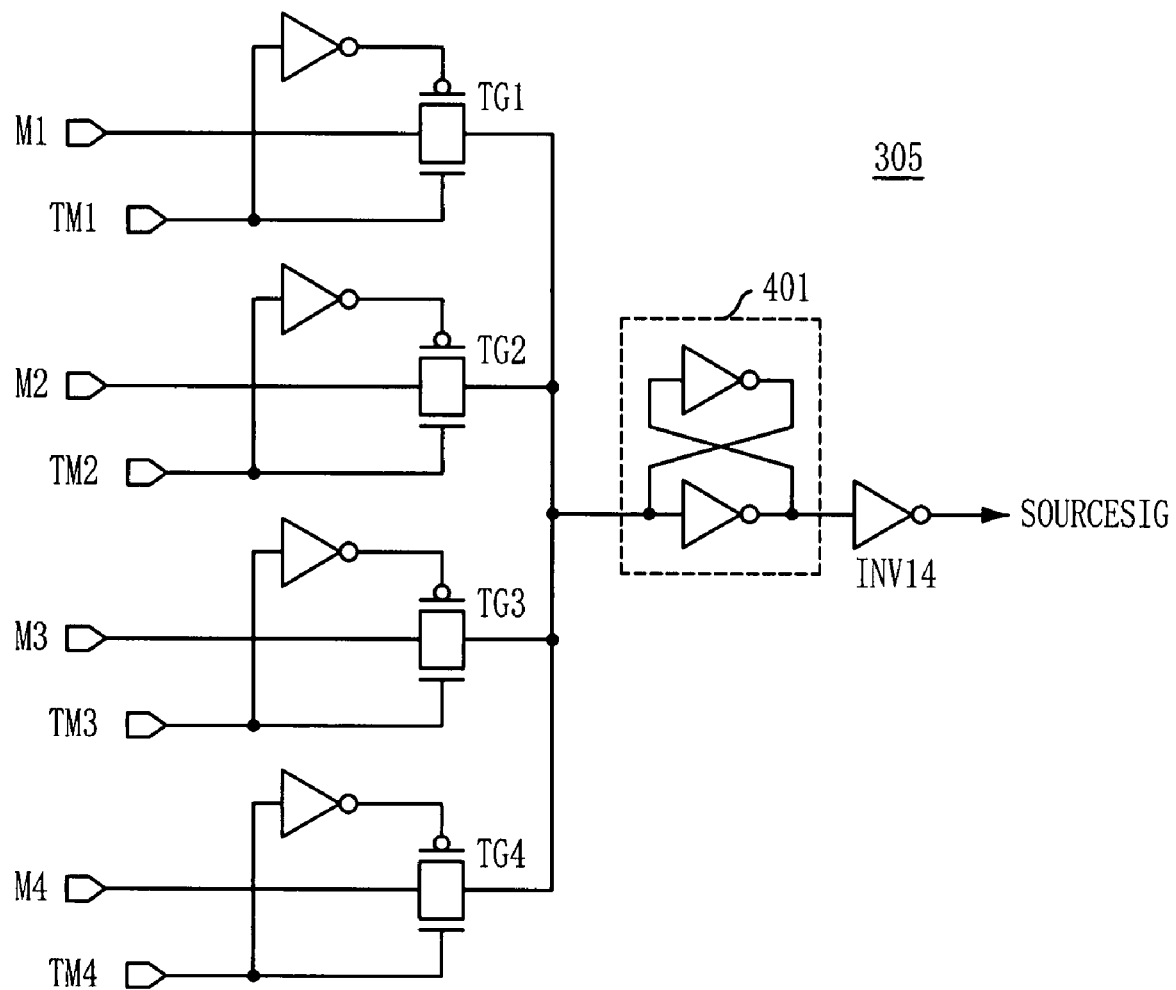
FIG. 4 is a circuit diagram illustrating a combiner shown in FIG. 3.

Referring to FIG. 4, the combiner 305 includes first to fourth transmission gates TG1, TG2, TG3 and TG4, a latch circuit 401 and an inverter INV14.

The first transmission gate TG1 delivers the first individual monitor source signal M1 based on the first separate test mode signal TM1. The second transmission gate TG2 delivers the second individual monitor source signal M2 based on the second separate test mode signal TM2. The third transmission gate TG3 delivers the third individual monitor source signal M3 based on the third separate test mode signal TM3. The fourth transmission gate TG4 delivers the fourth individual monitor source signal M4 based on the fourth separate test mode signal TM4. The latch circuit 401 latches any one of the output signals of the first to fourth transmission gates TG1 to TG4. The inverter INV14 inverts an output signal of the latch circuit 401 to output the monitor source signal SOURCESIG. In this case, the latch circuit 401 may be an inverted latch circuit.

Now, the internal signal output units 203 and 253 shown in FIGS. 2A and 2B are described, wherein the internal signal output units 203 and 253 are the same circuit, and thus, only the internal signal output unit 253 is described in connection with FIGS. 5A to 5D.

Figure 5A:
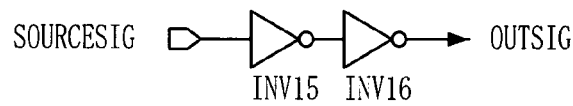
FIGS. 5A to 5D are circuit diagrams illustrating an internal signal output unit shown in FIG. 2B.

Referring to FIG. 5A, the internal signal output unit 253 includes two buffers INV15 and INV16 connected in series. The buffers INV15 and INV16 buffer the monitor source signal SOURCESIG to transmit it to the pad (not shown) such as an address pad, a data pad, a command pad and a monitor dedicated pad.

Figure 5B:
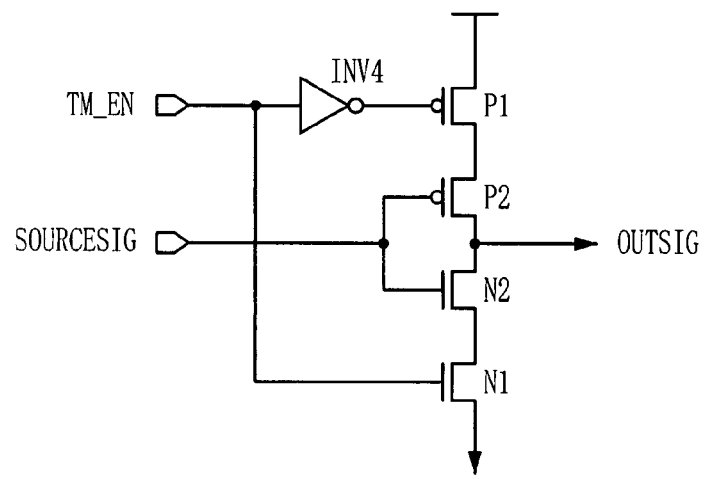

In FIG. 5B, the internal signal output unit 253 includes an inverter INV4, first and second PMOS transistors P1 and P2, and first and second NMOS transistors N1 and N2.

The inverter INV4 inverts a test mode signal TM_EN. The first PMOS transistor P1 receives an output signal of the inverter INV4 as its gate input signal. The first NMOS transistor N1 receives the test mode signal TM_EM as its gate input signal. The second PMOS transistor P2 and the second NMOS transistor N2 receive the monitor source signal SOURCESIG as their gate input signals, and a common output stage of the second PMOS transistor P2 and the second NMOS transistor N2 is coupled to the pad (not shown).

Figure 5C:
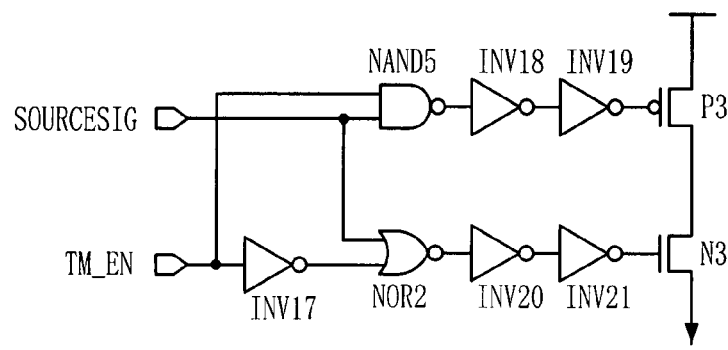

Referring to FIG. 5C, the internal signal output unit 253 may be implemented by first to fifth inverters INV17 to INV21, a NAND gate NAND5, a NOR gate NOR2, a PMOS transistor P3 and an NMOS transistor N3.

The first inverter INV17 inverts a test mode signal TM_EM. The NAND gate NAND5 receives the test mode signal TM_EM and the monitor source signal SOURCESIG. The second and third inverters INV18 and INV19 buffer an output signal of the NAND gate NAND5. The PMOS transistor P3 receives an output signal of the third inverter INV19 as its gate input signal. The NOR gate NOR2 receives an output signal of the first inverter INV17 and the monitor source signal SOURCESIG. The fourth and fifth inverters INV20 and INV21 buffer an output signal of the NOR gate NOR2. The NMOS transistor N3 receives an output signal of the fifth inverter INV21 as its gate input signal. A common output stage of the PMOS transistor P3 and the NMOS transistor N3 is coupled to the pad (not shown).

Figure 5D:
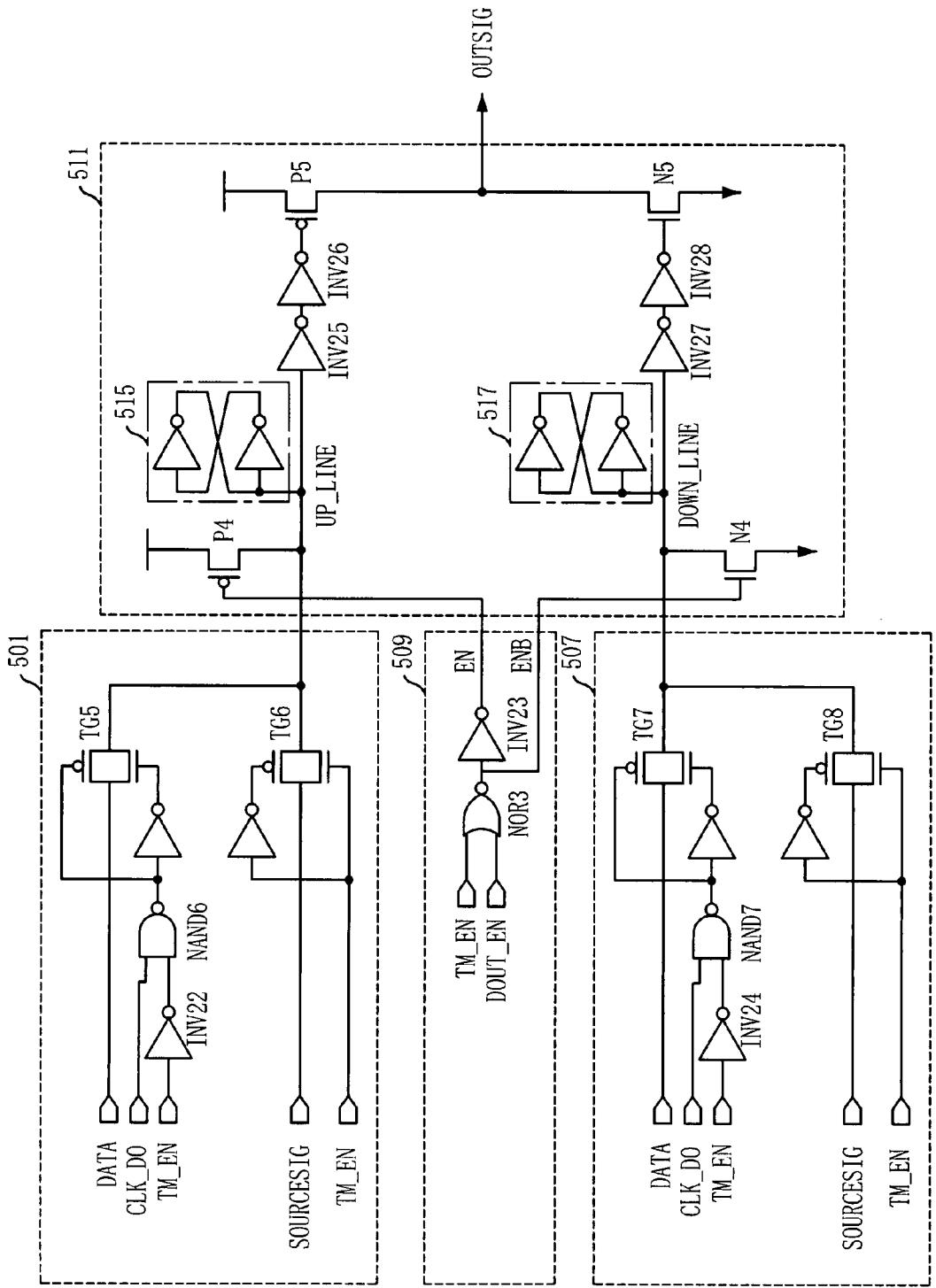

FIG. 5D shows the internal signal output unit 253 for coupling a monitor signal OUTSIG to the pad (not shown), e.g., a data pad. The internal signal output unit 253 has a first transfer sector 501, a second transfer sector 507, a controller 509 and an output stage 511.

Note that the monitor signal OUTSIG has to be output to the data pad without collision of data and the monitor source signal SOURCESIG. An internal signal output unit 253 for preventing such a collision is described.

The first transfer sector 501 includes a first inverter INV22, a first NAND gate NAND6 and first and second transmission gates TG5 and TG6. The first inverter INV22 inverts a test mode signal TM_EM. The first NAND gate NAND6 receives an output signal of the first inverter INV22 and an output clock signal CLK_DO. The first transmission gate TG5 delivers a data signal DATA in response to an output signal of the first NAND gate NAND6. The second transmission gate TG6 delivers the monitor source signal SOURCESIG in response to the test mode signal TM_EM. The signals output from the first and second transmission gates TG5 and TG6 are delivered to an upper line UP_LINE of the output stage 511.

The second transfer sector 507 includes a second inverter INV24, a second NAND gate NAND7, and third and fourth transmission gates TG7 and TG8. The second inverter INV24 inverts the test mode signal TM_EM. The second NAND gate NAND7 receives an output signal of the second inverter INV24 and the output clock signal CLK_DO. The third transmission gate TG7 delivers the data signal DATA in response to an output signal of the second NAND gate NAND7. The fourth transmission gate TG8 delivers the monitor source signal SOURCESIG in response to the test mode signal TM_EM. The signals output from the third and the fourth transmission gates TG7 and TG8 are delivered to a lower line DOWN_LINE of the output stage 511.

The controller 509 includes a first NOR gate NOR3 and a third inverter INV23. The first NOR gate NOR3 receives a data output signal DOUT_EN to output a first reset signal ENB, and the third inverter INV23 inverts an output signal of the first NOR gate NOR3 to output a second reset signal EN, wherein the data output signal DOUT_EN is for controlling an output of the test mode signal TM_EM and the data signal DATA, the first reset signal ENB is for resetting the lower line of the output stage 511 and the second reset signal EN is for resetting the upper line of the output stage 511.

The output stage 511 includes first and second PMOS transistors P4 and P5, first and second NMOS transistors N4 and N5, first and second latch circuits 515 and 517, and fourth to seventh inverters INV25 to INV28.

The first PMOS transistor P4 receives the second reset signal EN to reset the upper line UP_LINE. The first latch circuit 515 latches an output signal of the first transfer sector 501. The fourth and fifth inverters INV25 and INV26 buffer an output signal of the first latch circuit 515. The second PMOS transistor P5 receives an output signal of the fifth inverter INV26 as its gate input signal. The first NMOS transistor N4 receives the first reset signal ENB to reset the lower line DOWN_LINE. The second latch circuit 517 latches an output signal of the second transfer sector 507. The sixth and seventh inverters INV27 and INV28 buffer an output signal of the second latch circuit 517. The second NMOS transistor N5 receives an output signal of the seventh inverter INV28 as its gate input signal.

The internal signal output unit 253 operates as follows: when the data output signal DOUT_EN and the test mode signal TM_EM are in a logic level LOW, the output stage 511 is disabled, and then when the test mode signal TM_EM becomes a logic level HIGH in a test mode, the output stage 511 goes to be enabled.

At the same time, in response to the test mode signal TM_EM, the first transmission gate TG5 in the first transfer sector 501 and the third transmission gate TG7 in the second transfer sector 507 are disabled, while the second and the fourth transmission gates TG6 and TG8 are enabled. That is, the data signal DATA is not delivered to the output stage 511 and the monitor source signal SOURCESIG is delivered to the output stage 511.

Thereafter, the output stage 511 receives the monitor source signal SOURCESIG to generate and deliver the monitor signal OUTSIG to the data pad.

There may be a plurality of internal signal monitoring devices for using a data pad as an output pad of a monitor signal OUTSIG.

Figure 6:
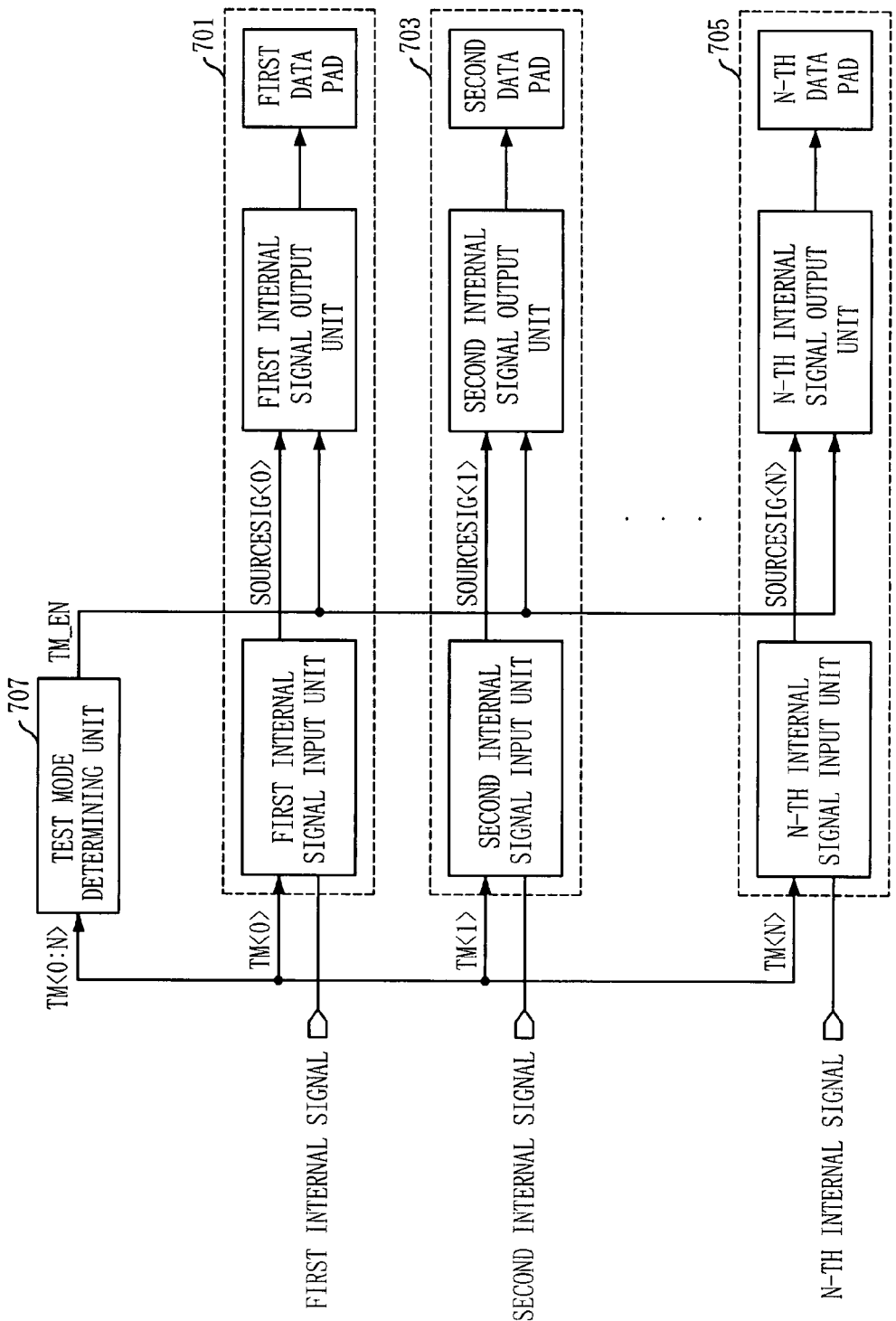
FIG. 6 is a block diagram illustrating a plurality of internal signal monitoring devices in which a data pad is used as a pad for receiving a monitor signal.

FIG. 6 shows a block diagram illustrating the plurality of internal signal monitoring devices using the data pad as the output pad of the monitor signal OUTSIG.

In FIG. 6, a semiconductor memory device includes a first monitoring device 701, a second monitoring device 703, an n-th monitoring device 705 and a test mode determining unit 707 for controlling these monitoring devices.

Because the data pad is used for inputting/outputting data, use of the data pad to monitor an internal signal may have to be constrained when reading out data, which has to be output in a normal operation, from a memory cell. However, for a typical semiconductor memory device, e.g. DRAM, various bit organizations such as X4, X8 or X16 operational modes are integrated on a single chip. Therefore, in X4 or X8 operational modes, 8 or 12 data pads are not used and are hence available as spare pads, and thus it is possible to reduce the need for additional pads, if the spare pads are used for internal signal monitoring. Further, although data is not actually output to the data pad in test mode, it is reasonable to monitor the internal signal by using the spare pads to capture the states of the memory device.

The operation of each of the plurality of internal signal monitoring devices, which uses the data pad as the output pad of the monitor signal OUTSIG, will be understood by those skilled in the art from the above description of the internal signal input unit with respect to FIG. 5D and thus is not described.

Figure 7:
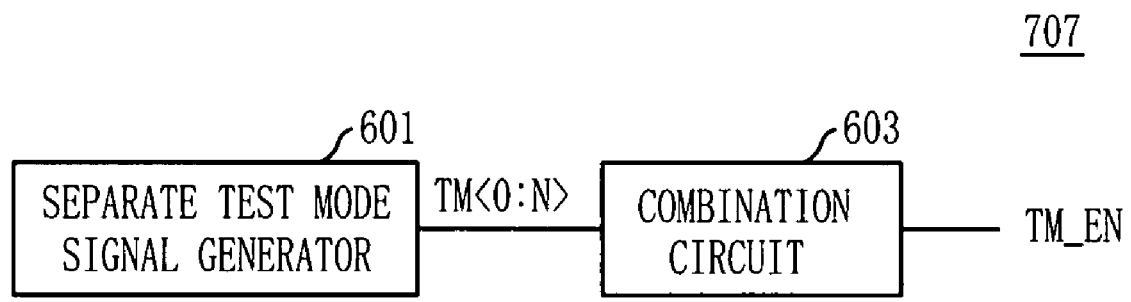
FIG. 7 is a circuit diagram illustrating a test mode determining unit shown in FIG. 6.

FIG. 7 shows a circuit diagram illustrating the test mode determining unit 707.

The test mode determining unit 707 has a separate test mode signal generator 601 and a combination circuit 603. The separate test mode signal generator 601 generates a separate test mode signal group TM<0:n>. The combination circuit 603 combines the separate test mode signal group TM<0:n> to output a test mode signal TM_EN.

The combination circuit 603 includes a NOR gate for receiving the separate test mode signal group TM<0:n> and an inverter for inverting an output signal of the NOR gate to output the test mode signal TM_EN.

Figure 8A:
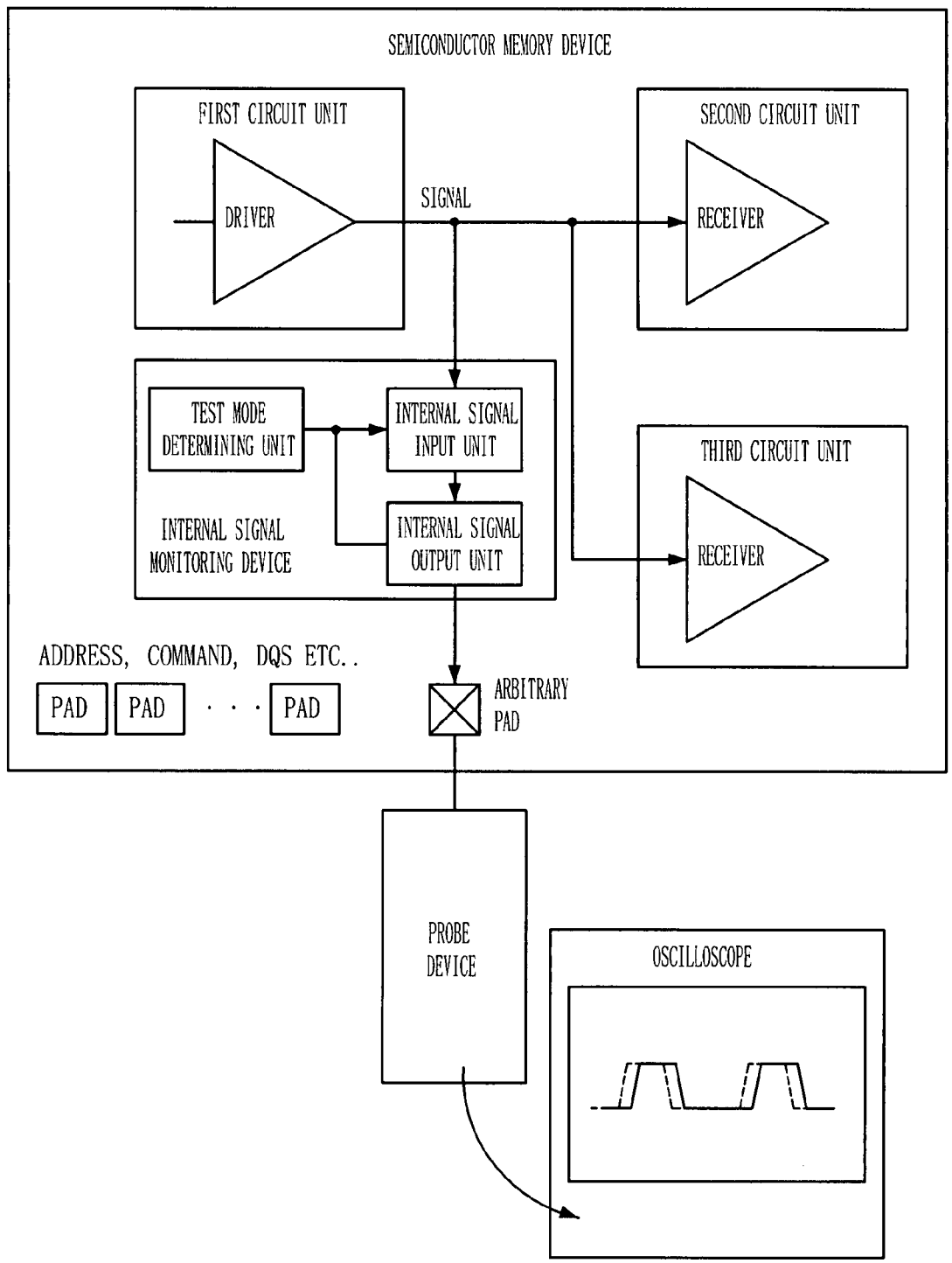
FIGS. 8A and 8B are block diagrams illustrating a semiconductor memory device employing an internal signal monitoring device according to the present invention.
Figure 8B:
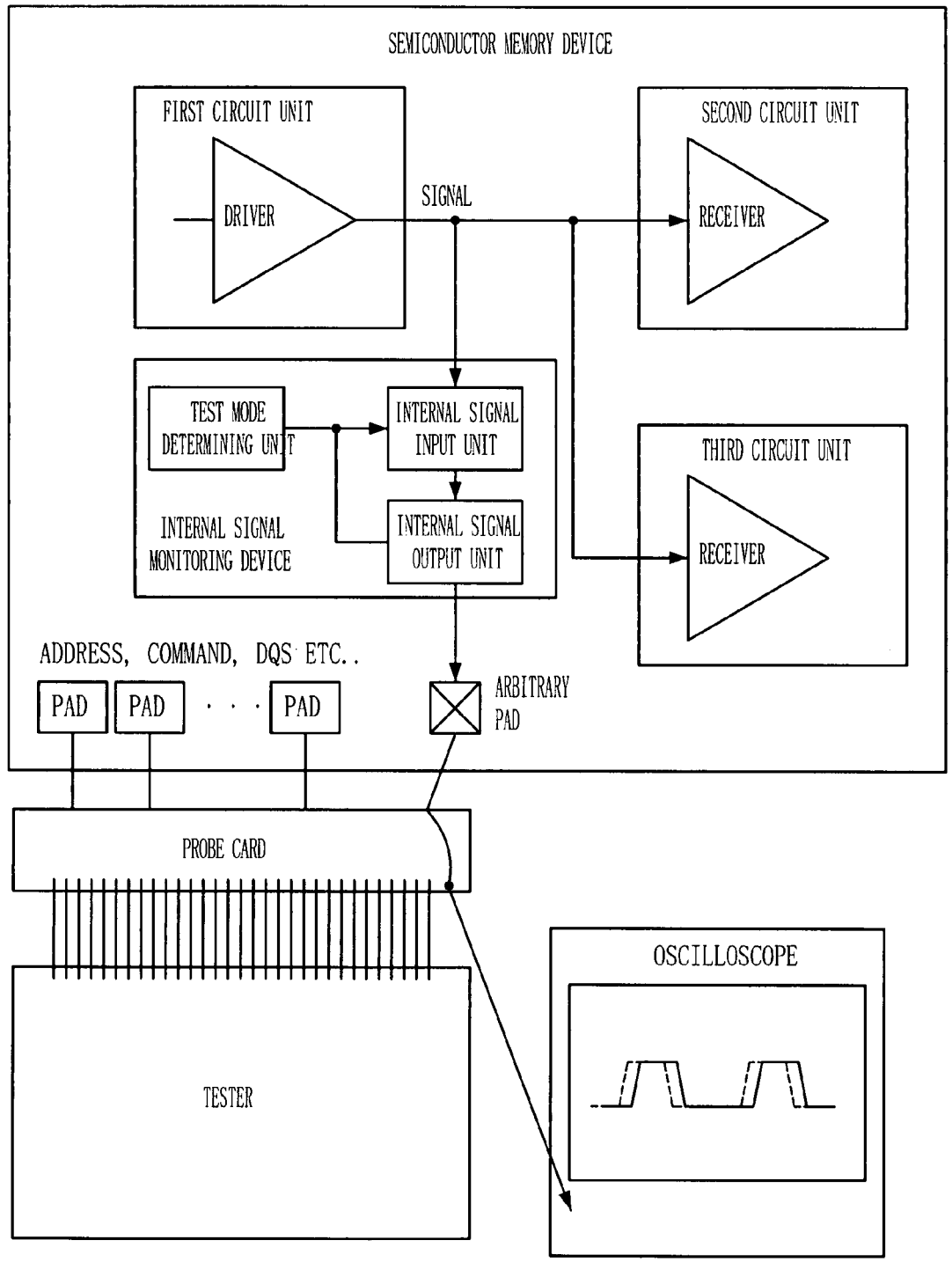

Thus designed the internal signal monitoring device can be integrated into a semiconductor memory device as shown in FIGS. 8A and 8B.

In FIG. 8A, a probe device is used to monitor an internal signal transmitted to a pad, whereby a conventional problem with respect to a distortion of the internal signal can be solved using the integrated, internal signal monitoring device.

Referring to FIG. 8B, a probe card is used to monitor an internal signal transmitted to a pad (by the integrated internal signal monitoring device), whereby a conventional problem with respect to a distortion of the internal signal can be solved.

As described above, when monitoring an internal signal in a semiconductor memory device, a conventional monitoring operation has a problem that the internal signal is monitored in a distorted state because the conventional monitoring operation was performed in a manner that a probe was directly contacting the node to be inspected. This problem can be overcome if the monitoring operation is controlled by the test mode signal and a monitor signal indicating a state of the internal signal is transmitted to a pad, in accordance with the present invention.

Further, when monitoring an internal signal in a packaged semiconductor memory device, a conventional monitoring operation is carried out after removing a packaging material, whereas a monitoring operation in accordance with the present invention allows monitoring the internal signal transmitted to a pad through an external pin without having to remove the packaging material.

The present invention is not limited to the described description and the accompanying drawings, and it will be obvious to those skilled in the art that various modifications, changes and variations can be made to the preferred embodiment of the present invention without departing from the scope and spirit of the present invention.

While the logic circuitry used in the preferred embodiment of the present invention is shown for the case where the input and output signals are active when they are logic HIGH, the type of logic circuitry and their construction can be varied depending on a polarity of the active signal. Further, since the different kinds of logic circuitry and their constructions are too numerous to mention one by one, and the variations thereof can be understood by those skilled in the art from the teachings of the disclosure herein, the details thereof will be not described.

Furthermore, the internal signal input unit and the internal signal output unit are described to include a plurality of logic circuits but they are merely an example.

As seen from the above, the present invention can easily monitor an internal signal, through a pad that receives a monitored version of the internal signal, and does not disturb the internal signal. This prevents an operational error that would have been caused by distortion of the internal signal.

Further, the present invention can monitor an internal signal in a packaged semiconductor memory device through an external pin bonded to a pad, thereby facilitating a monitoring of the internal signal and reducing a time required to develop a product.

What is claimed is:

1. An internal signal monitoring device in a semiconductor memory device, comprising:
   an internal signal input unit configured to receive an internal signal to be monitored and a test mode signal and to provide a monitor source signal in response to the test mode signal, which is activated during a test mode operation; and
   an internal signal output unit configured to receive the monitor source signal from the internal signal input unit and the test mode signal and to transmit the monitor source signal to a predetermined pad of the semiconductor memory device in response to the test mode signal, which is activated during the test mode operation,
   said predetermined pad comprising in addition receiving said monitor source signal, an address pad for receiving an address signal, a data pad for receiving or outputting data, a command pad for receiving a command signal,
   wherein the monitor source signal is output dependent upon the test mode activated during the test mode operation, said activated test mode signal also inhibiting said predetermined pad from i) receiving said address signal, ii) receiving or outputting data, and iii) receiving a command signal,
   wherein the internal signal output unit includes:
   a NAND gate for receiving the test mode signals and the monitor source signal;
   a first buffer unit for buffering an output signal of the NAND gate;
   a PMOS transistor, coupled to the pad, for receiving an output signal of the first buffer unit as a gate input signal;
   an inverter for inverting the test mode signal;
   a NOR gate for receiving an output signal or the inverter and the monitor source signal;
   a second buffer unit for buffering an output signal of the NOR gate; and
   an NMOS transistor, coupled to the predetermined pad, for receiving an output signal of the second buffer unit as a gate input signal.

2. An internal signal monitoring device in a semiconductor memory device, comprising:
   an internal signal input unit configured to receive a plurality of internal signals to be monitored and a plurality of separate test mode signals and to provide a monitor source signal in response to an activated separate test mode signal of the plurality of separate test mode signals; and
   an internal signal output unit configured to receive the monitor source signal from the internal signal input unit and a test mode signal and to transmit the monitor source signal to a predetermined pad of the semiconductor memory device in response to the test mode signal, which is activated during a test mode operation,
   said predetermined pad comprising in addition to receiving said monitor source signal, an address pad for receiving an address signal, a data pad for receiving or outputting data, a command pad for receiving a command signal,
   wherein the monitor source signal is output dependent upon the test mode activated during the test mode operation, said activated test mode signal also inhibiting said predetermined pad from i) receiving said address signal, ii) receiving or outputting data, and iii) receiving a command signal,
   wherein the internal signal output unit includes:
   a NAND gate for receiving a corresponding one of the plurality of separate test mode signals and the monitor source signal;
   a first buffer unit for buffering an output signal of the NAND gate;
   a PMOS transistor, coupled to the pad, for receiving an output signal of the first buffer unit as a gate input signal;
   an inverter for inverting a corresponding one of the plurality of separate test mode signals;
   a NOR gate for receiving an output signal of the inverter and the monitor source signal;
   a second buffer unit for buffering an output signal of the NOR gate; and
   an NMOS transistor, coupled to the predetermined pad, for receiving an output signal of the second buffer unit as a gate input signal.

3. The internal signal monitoring device of claim 2, wherein the internal signal input unit includes:
   a plurality of input units for respectively receiving the plurality of internal signals and the plurality of separate test mode signals to output a plurality of input signals; and
   a combiner for combining the plurality of input signals output from the plurality of input units.

4. The internal signal monitoring device of claim 3, wherein each of the plurality of input units includes:
   a NAND gate for receiving a corresponding one of the plurality of internal signals and a corresponding one of the plurality of separate test mode signals; and
   a buffering unit for buffering an output signal of the NAND gate to output a corresponding one of the input signals.

5. The internal signal monitoring device of claim 4, wherein the buffering unit includes a plurality of inverters.

6. The internal signal monitoring device of claim 3, wherein the combiner includes:
   a NOR gate for receiving the plurality of input signals; and
   an inverter for inverting an output signal of the NOR gate to output the monitor source signal.

7. The internal signal monitoring device of claim 3, wherein the combiner includes:
   a plurality of first transmission gates, each for delivering a corresponding one of the plurality of input signals in response to a corresponding one of the plurality of separate test mode signals;
   a latch circuit for latching output signals of the transmission gates; and an inverter for inverting an output signal of the latch circuit to output the monitor source signal.

8. The internal signal monitoring device of claim 2, wherein each of the first buffer unit and second buffer unit includes a plurality of inverters.

9. The internal signal monitoring device of claim 2, further comprising a test mode determining unit configured to generate and combine the plurality of separate test mode signals to output the test mode signal.

10. The internal signal monitoring device of claim 9, wherein the test mode determining unit includes:
   a separate test mode signal generator configured to generate the plurality of separate test mode signals; and
   a combination circuit configured to combine the plurality of separate test mode signals to output the test mode signal.

* * * * *